United States Patent
Ichimaru et al.

(10) Patent No.: US 6,995,531 B2
(45) Date of Patent: Feb. 7, 2006

(54) DIRECT CURRENT MOTOR DRIVE CIRCUIT AND FAN MOTOR INCLUDING THE SAME

(75) Inventors: Masanori Ichimaru, Usa (JP); Kouichi Inayama, Usa (JP); Masatomo Kumashiro, Usa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/084,198

(22) Filed: Mar. 21, 2005

(65) Prior Publication Data

US 2005/0218844 A1    Oct. 6, 2005

(30) Foreign Application Priority Data

Mar. 22, 2004   (JP)   .................. P. 2004-082276

(51) Int. Cl.
*H02P 3/18*    (2006.01)
(52) U.S. Cl. ............ 318/254; 318/138; 318/439; 388/907; 388/907.2; 388/921
(58) Field of Classification Search ............ 318/138, 318/254, 439, 432, 434; 388/907, 907.2, 388/921
See application file for complete search history.

(56) References Cited

U.S. PATENT DOCUMENTS 5,089,761 A  *  2/1992  Nakazawa .................. 318/811
5,428,522 A  *  6/1995  Millner et al. .............. 363/63
5,563,980 A  * 10/1996  Chen et al. ................. 388/811
5,859,519 A  *  1/1999  Archer ....................... 318/801
5,977,737 A  * 11/1999  Labriola, II ................ 318/599
5,978,547 A  * 11/1999  Reynolds et al. .......... 388/811
6,891,346 B2 * 5/2005  Simmons et al. .......... 318/439

FOREIGN PATENT DOCUMENTS

| JP | 9331692 | 12/1997 |
| JP | 2004040918 | 2/2004 |
| JP | 2004260965 | 9/2004 |

* cited by examiner

*Primary Examiner*—Rina Duda
(74) *Attorney, Agent, or Firm*—Stevens, Davis, Miller & Mosher, LLP

(57) ABSTRACT

A direct current motor drive circuit comprises: a hall element; an H-bridge drive circuit which receives an input of a sinusoidal signal outputted from the hall element and outputs rectangular wave signals corresponding to the sinusoidal signal; a dead time circuit which carries out rectangular wave signal processing for the rectangular signals; and an H-bridge circuit which receives the output signals of the dead time circuit, in that the H-bridge circuit includes a first series circuit in which a second switching element connected to a positive power supply voltage and a first FET connected to the ground are connected in series via a first node, a second series circuit in which a first switching element connected to the positive power supply voltage and a second FET connected to the ground are connected in series via a second node, and a coil of the direct current motor connected to the first node and the second node.

11 Claims, 6 Drawing Sheets

FIG. 2 (a) OUTPUT VOLTAGE a (1a - 1b) OF HALL ELEMENT 1
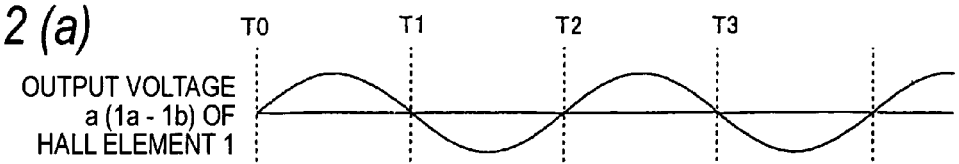
FIG. 2 (b) b (P1)
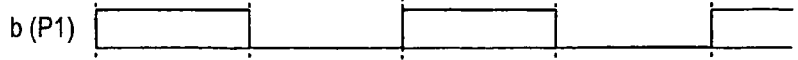
FIG. 2 (c) c (P2)
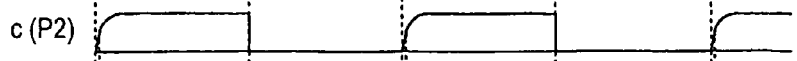
FIG. 2 (d) d (P3)
FIG. 2 (e) e (FET4)
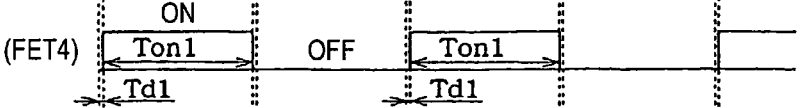
FIG. 2 (f) f (FET5)
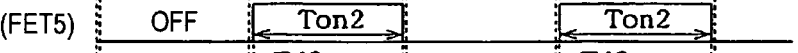
FIG. 2 (g) APPLIED CURRENT g IN MOTOR COIL 8
FIG. 2 (h) DRAIN CURRENT h OF FET 4
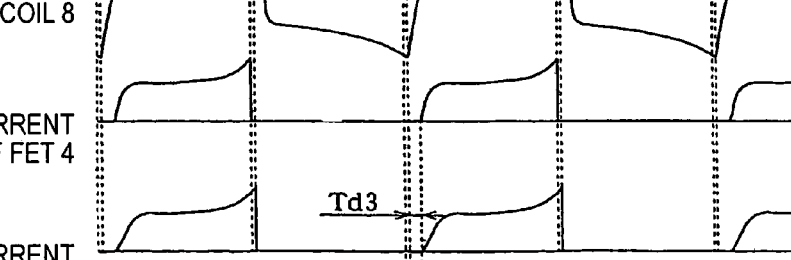
FIG. 2 (i) COLLECTOR CURRENT i OF TRANSISTOR 6
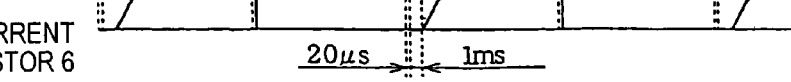

DIRECT CURRENT MOTOR DRIVE CIRCUIT AND FAN MOTOR INCLUDING THE SAME

BACKGROUND OF THE INVENTION

The present invention relates to a direct current motor drive circuit which drives a brushless direct current motor for rotating a magnet rotor by a motor coil which switches polarities of a plurality (for example, four) of magnetic poles when the direction of an applied current is changed.

FIG. 3 is a circuit diagram showing a conventional direct current motor drive circuit described in, for example, JP-A-9-331692.

In FIG. 3, the reference numeral 101 denotes a hall element which is disposed between magnetic poles formed by a motor coil (described later) forming a stator of a direct current motor and detects a rotating position of a magnet rotor, the reference numeral 102 denotes an IC which outputs a signal for switching the energization direction (direction of the applied current) of the motor coil, the reference numerals 105a and 105b denote P channel metal oxide semiconductor field effect transistors (referred to as MOSFETs), the reference numerals 106a and 106b are N channel MOSFETs, the reference numerals 130a through 132a and 130b through 132b denote transistors, the reference numeral 109 denotes a motor coil which switches polarities of a plurality (for example, four) of magnetic poles when the applied current direction is changed, and the reference symbol T denotes a power supply terminal to which a direct current power of a direct current voltage Vcc (for example, 12V) is supplied.

Herein, the transistors 131a, 131b, 132a, and 132b form a dead time generation circuit which generates a dead time for preventing power supply shortcircuits due to simultaneous energization when the phase is switched in the H-bridge circuit described later, the transistors 130a and 130b form an H-bridge drive circuit for driving the H-bridge circuit, and the P channel MOSFETs 105a and 105b, the N channel MOSFETs 106a and 106b, and the motor coil 109 form the H-bridge circuit. In FIG. 3, all circuits except for the motor coil 109 form a direct current motor drive circuit.

Connections and operations of the direct current motor drive circuit thus constructed are described.

An output of the IC 102 is connected to transistors 131a and 131b for low frequency amplifying, and outputs of the transistors 131a and 131b are connected to bases of PNP small signal transistors 130a and 130b which drive gates of the MOSFETs, respectively, outputs of the transistors 131a and 131b are connected to bases of the transistors 132b and 132a, respectively, collectors thereof are connected to the transistors 130b and 130a, emitters of the small signal transistors 130a and 130b are connected to gates of the P channel MOSFETs 105a and 105b and collectors of the small signal transistors 130a and 130b are connected to gates of the N channel MOSFETs 106a and 106b, and the transistors 130a and 130b are alternately turned on and off by the IC 102 that outputs a signal for switching the energization direction of the motor coil 109.

When the transistor 130a is on, the MOSFETs 105a and 106a are turned on, the motor coil 109 is energized from left to right, and thereafter, when the transistor 130a is turned off, the transistor 130b is turned on and the MOSFETs 105b and 106b are turned on and a current in reverse to the previous direction is supplied to the motor coil 109.

Thus, in a conventional direct current motor drive circuit, the transistors 131a, 131b, 132a, and 132b form a dead time generation circuit and the transistors 130a and 130b form an H-bridge drive circuit. Therefore, in a brushless DC motor or the like adapted to alternating current inputs by converting an alternating current voltage inputted from a power supply terminal into a direct current voltage by a rectifier circuit (not shown) in the motor, when the direct current voltage Vcc is high, for example, 110V (namely, when the H-bridge circuit is made so as to withstand a higher voltage), the transistors 130a through 132a and 130b through 132b must also be changed to high-withstand voltage transistors, and the direct current motor drive circuit becomes expensive.

In this direct current motor drive circuit, it has been demanded that the direct current motor drive circuit can be simplified and prevented from becoming expensive even when the H-bridge circuit is made so as to withstand a higher voltage.

SUMMARY OF THE INVENTION

In order to satisfy this demand, an object of the invention is to provide a direct current motor drive circuit which can be simplified and prevented from becoming expensive even when the H-bridge circuit is made to withstand a higher voltage.

The invention achieves the object to prevent the direct current motor drive circuit from becoming expensive even when the H-bridge circuit is made to withstand a higher voltage by driving the H-bridge circuit by output signals of two comparators.

According to a first aspect of the invention for solving the above-mentioned problem, a direct current motor drive circuit for driving a brushless direct current motor, comprises: a hall element disposed between predetermined magnetic poles of a coil of the brushless direct current motor; an H-bridge drive circuit including a first comparator which receives an input of a sinusoidal signal outputted from the hall element and outputs a first rectangular wave signal corresponding to the positive voltage of the sinusoidal signal and a second comparator which receives an input of the first rectangular wave signal and outputs a second rectangular wave signal corresponding to the negative voltage of the sinusoidal signal; a dead time circuit which carries out rectangular wave signal processing for turning the first rectangular signal and the second rectangular signal on at timings in which their ON voltage periods are different; and an H-bridge circuit which receives inputs of the first rectangular wave signal and the second rectangular wave signal subjected to signal processing in the dead time circuit, wherein the H-bridge circuit includes a first series circuit in which a second switching element connected to a positive power supply voltage and a first field effect transistor (referred to as FET) connected to the ground are connected in series via a first node, a second series circuit in which a first switching element connected to the positive power supply voltage and a second FET connected to the ground are connected in series via a second node, and a coil of the direct current motor connected to the first node and the second node.

According to a second aspect of the invention for solving the above-mentioned problem, a direct current motor drive circuit which drives a brushless direct current motor for rotating a magnet rotor by a motor coil that switches polarities of a plurality of magnetic poles when an applied current direction is changed, comprises a hall element disposed between predetermined magnetic poles of the motor coil, a first comparator which receives an input of a sinusoidal signal outputted from the hall element and outputs the first rectangular wave signal corresponding to the positive voltage of the sinusoidal signal, a second comparator which receives an input of a first rectangular wave signal and outputs a second rectangular wave signal corresponding to the negative voltage of the sinusoidal signal, a first dead time circuit which provides the first rectangular wave signal with gentle rises and steep falls and outputs it as a first rectangular wave processed signal, a second dead time circuit which provides the second rectangular wave signal with gentle rises and steep falls and outputs it as a second rectangular wave processed signal, an H-bridge circuit which receives inputs of the first rectangular wave processed signal and the second rectangular wave processed signal, wherein the H-bridge circuit includes a first series circuit in which a second switching element connected to a positive power supply voltage and a first field effect transistor (referred to as FET) connected to the ground are connected in series via a first node, a second series circuit in which a first switching element connected to a positive power supply voltage and a second FET connected to the ground are connected in series via a second node, and the motor coil connected to the first node and the second node.

According to a third aspect of the invention for solving the above-mentioned problem, the first switching element and the second switching element are a first PNP transistor and a second PNP transistor, respectively, emitters of the first PNP transistor and the second PNP transistor are connected to the positive power supply voltage, collectors of the first PNP transistor and the second PNP transistor are connected to drains of the second FET and the first FET, respectively, bases of the first PNP transistor and the second PNP transistor are connected to drains of the first FET and the second FET via a third resistor and a fourth resistor, respectively, the first rectangular wave processed signal and the second rectangular wave processed signal are inputted to gates of the first FET and the second FET, and sources of the first FET and the second FET are connected to the ground.

According to a fourth aspect of the invention for solving the above-mentioned problem, the first switching element and the second switching element are a first P channel FET and a second P channel FET, respectively, and sources of the first P channel FET and the second P channel FET are connected to the positive power supply voltage, drains of the first P channel FET and the second P channel FET are connected to drains of the second FET and the first FET, respectively, gates of the first P channel FET and the second P channel FET are connected to drains of the first FET and the second FET via a third resistor and a fourth resistor, respectively, the rectangular wave processed signal and the second rectangular wave processed signal are inputted to gates of the first FET and the second FET, and sources of the first FET and the second FET are connected to the ground.

According to a fifth aspect of the invention for solving the above-mentioned problem, the first dead time circuit includes a first resistor connected to a third node as an output point of the first comparator and a first capacitor connected in series to the first resistor via a fourth node, where the fourth node is connected to the gate of the first FET, the second dead time circuit includes a second resistor connected to a high voltage side of a fifth node as an output point of the second comparator and a second capacitor connected in series to the second resistor via the fifth node, where the fifth node is connected to the gate of the second FET.

Thereby, a direct current motor drive circuit is obtained which can be simplified and prevented from becoming expensive even when the H-bridge circuit is made to withstand a higher voltage.

A direct current motor circuit of the invention drives a brushless direct current motor for rotating a magnet rotor by a motor coil which switches polarities of a plurality of magnetic poles when an applied current direction is changed, comprising a hall element disposed between predetermined magnetic poles of the motor coil, an H-bridge circuit to be driven based on a sinusoidal signal outputted from the hall element, wherein the H-bridge circuit includes a first series circuit in which a second switching element connected to a positive power supply voltage and a first FET connected to the ground are connected in series via a first node, a second series circuit in which a first switching element connected to the positive power supply voltage and a second FET connected to the ground are connected in series via a second node, and a motor coil connected to the first node and the second node, whereby the first switching element or the second switching element on the high voltage side (positive power supply voltage side) forming the H-bridge circuit is driven by the first FET or the second FET on the ground side, the first comparator or the second comparator as a drive circuit for driving the H-bridge circuit drives only the first FET or the second FET, and it is not necessary that the first switching element or the second switching element on the high voltage side (positive power supply voltage side) is driven by an independent separate circuit, and therefore, a drive circuit conventionally required for the high voltage side switching element is omitted and the entire circuit can be simplified, and even when the H-bridge circuit is made so as to withstand a higher voltage, an advantageous effect can be obtained in that the direct current motor drive circuit can be prevented from becoming expensive. In addition, by providing the first and second dead time circuits, an advantageous effect is obtained in that the first and second FETs or the first and second switching elements are prevented from being simultaneously turned on.

Furthermore, the first switching element and the second switching element are a first PNP transistor and a second PNP transistor, respectively, emitters of the first PNP transistor and the second PNP transistor are connected to a positive power supply voltage, collectors of the first PNP transistor and the second PNP transistor are connected to drains of the second FET and the first FET, respectively, bases of the first PNP transistor and the second PNP transistor are connected to drains of the first FET and the second FET via a third resistor and a fourth resistor, respectively, the first rectangular wave processed signal and the second rectangular wave processed signal are inputted to gates of the first FET and the second FET, and sources of the first FET and the second FET are connected to the ground, whereby an advantageous effect is obtained in that the PNP transistors on the high voltage side can be driven reliably by the FETs on the ground side.

Furthermore, the first switching element and the second switching element are a first P channel FET and a second P channel FET, respectively, sources of the first P channel FET and the second P channel FET are connected to a positive power supply voltage, drains of the first P channel FET and the second P channel FET are connected to drains of the second FET and the first FET, respectively, gates of the first P channel FET and the second P channel FET are connected to drains of the first FET and the second FET via a third resistor and a fourth resistor, respectively, the first rectangular wave processed signal and the second rectangular wave processed signal are inputted to gates of the first FET and the second FET, and sources of the first FET and the second FET are connected to the ground, whereby an advantageous effect is obtained in that reliable driving is carried out by the P channel FETs on the high voltage side and the FETs on the ground side.

Furthermore, the direct current motor drive circuit is provided with a first comparator which receives an input of a sinusoidal signal outputted from the hall element and outputs a first rectangular wave signal corresponding to the positive voltage of the sinusoidal signal, a second comparator which receives an input of the first rectangular signal and outputs a second rectangular signal corresponding to the negative voltage of the sinusoidal signal, a first dead time circuit which provides the first rectangular wave signal with gentle rises and steep falls and outputs it as a first rectangular wave processed signal, and a second dead time circuit which provides the second rectangular wave signal with gentle rises and steep falls and outputs it as a second rectangular wave signal, and the H-bridge circuit receives inputs of the first rectangular wave processed signal and the second rectangular wave processed signal, whereby an advantageous effect is obtained in that the first switching element and the second FET or the second switching element and the first FET are prevented from being simultaneously energized in the H-bridge circuit.

Furthermore, the first dead time circuit includes a first resistor connected to a third node as an output point of the first comparator and a first capacitor connected in series to the first resistor via a fourth node, where the fourth node is connected to the gate of the first FET, the second dead time circuit includes a second resistor connected to a high voltage side of a fifth node as an output point of the second comparator and a second capacitor connected in series to the second resistor via the fifth node, where the fifth node is connected to the gate of the second FET, whereby the dead time circuit is formed by passive elements, and therefore, advantageous effects are obtained in that active elements for dead time generation can be omitted, the dead time circuits can be simplified, and costs are further lowered.

BRIEF DESCRIPTION OF THE DRAWINGS

FIG. 2(a) is a timing cart showing a sinusoidal signal a as an output voltage of the hall element, FIG. 2(b) is a timing chart showing an output voltage of the first comparator, FIG. 2(c) is a timing chart showing an output voltage c of the first dead time circuit, FIG. 2(d) is a timing chart showing an output voltage d of the second dead time generation circuit, FIG. 2(e) is a timing chart showing ON periods of the first FET, FIG. 2(f) is a timing chart showing ON periods f of the second FET, FIG. 2(g) is a timing cart showing a waveform of an applied current in the motor coil, FIG. 2(h) is a timing chart showing a waveform of a drain current of the first FET, and FIG. 2(i) is a timing chart showing a waveform of a collector current of the first PNP transistor.

DETAILED DESCRIPTION OF THE DRAWINGS

First Embodiment

Figure 1:
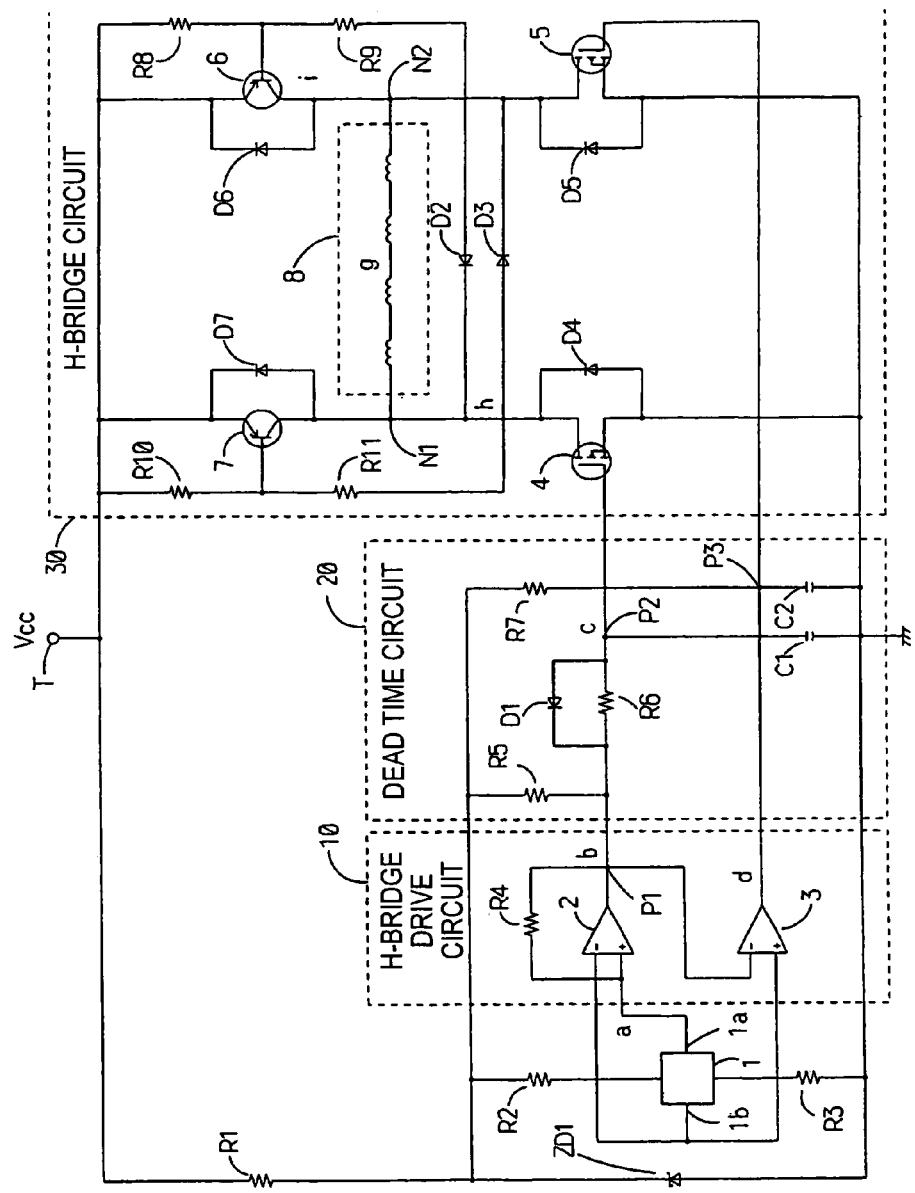
FIG. 1 is a circuit diagram showing the direct current motor drive circuit according to the first embodiment of the invention.
Figure 3:
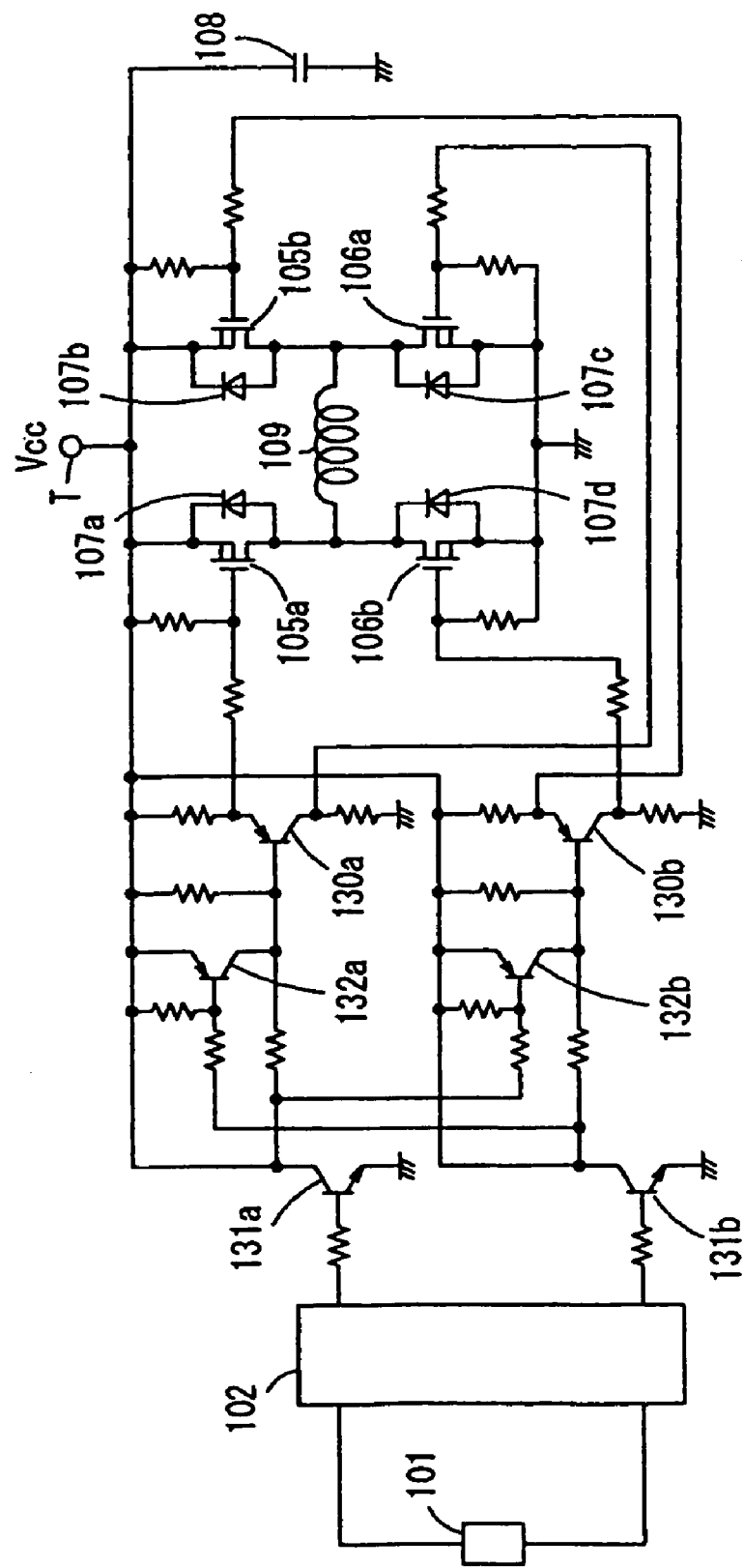
FIG. 3 is a circuit diagram showing a conventional direct current motor drive circuit.

FIG. 1 is a circuit diagram showing a direct current motor drive circuit according to a first embodiment of the invention.

In FIG. 1, a hall element 1 is disposed between magnetic poles formed by a motor coil 8 (described later) as a stator of a direct current motor and detects a rotating position of a magnet rotor as a rotor of the direct current motor, the reference numerals 1a and 1b denote output terminals of the hall element 1, a first comparator 2 receives an input of an output voltage of the hall element 1 and outputs a signal (rectangular wave signal) for switching the energization direction (direction of an applied current) of the motor coil 8, a second comparator 3 receives an input of an output voltage (rectangular wave signal) of the first comparator 2 and outputs a signal for switching the energization direction of the motor coil 8, first and second FETs 4 and 5 are driven by the first and second comparators 2 and 3, first and second PNP transistors 6 and 7 are driven by the first and second FETs 4 and 5, a motor coil 8 switches a plurality (for example, four) of magnetic poles N and S when the direction of an applied current is changed, and a power supply terminal T is supplied with a direct current power of a direct current voltage Vcc (for example, 110V). R1 through R11 denote resistors, a zener diode ZD1 supplies a rated voltage to the hall element 1 and the first and second comparators 2 and 3, C1 and C2 denote capacitors, D1 through D7 denote diodes, N1 and N2 denote the first and second nodes, and P1 through P3 denote the third through fifth nodes, and the resistors R5 and R6 (first resistor) and the capacitor C1 (first capacitor) form a first dead time generation circuit, and the resistor R7 (second resistor) and the capacitor C2 (second capacitor) form a second dead time generation circuit. A diode D1 makes the fall of the driving voltage (rectangular wave signal) of the first FET 4 at the node P2 steep, and diodes D2 and D3 prevent an induced voltage caused by a sudden change in applied current in the motor coil 8, and diodes D4 through D7 extinguish an induced voltage caused by a sudden change in applied current in the motor coil 8 by bypassing and converting it into a cyclic current. The first and second FETs 4 and 5, the first and second PNP transistors 6 and 7, and the motor coil 8 form an H-bridge circuit. The base side resistor R9 of the first PNP transistor 6 is a third resistor, and the base side resistor R11 of the second PNP transistor 7 is a fourth resistor. In FIG. 1, all circuits except for the motor coil 8 form a direct current motor drive circuit.

Connections and operations of the direct current motor drive circuit thus constructed are described.

First, connections are described. The output terminals 1a and 1b of the hall element 1 are connected to the input side of the first comparator 2, respectively, and the output side node P1 (third node) of the first comparator 2 is inputted to a time constant circuit as a first dead time generation circuit, and the output side node P2 (fourth node) of the time constant circuit is connected to the gate of the first FET 4. The output side node P1 (third node) of the first comparator 2 is connected to the input side of the second comparator 3, and the output side node P3 (fifth node) of the second comparator 3 is inputted to a time constant circuit as a second dead time generation circuit, and the output side node P3 of the time constant circuit is connected to the gate of the second FET 5. Furthermore, sources of the first and second FETs 4 and 5 are connected to the ground, drains of the second FETs 4 and 5 are connected to the collectors of the second and first PNP transistors 6 and 7, respectively, and diodes D4 and D5 for bypass are connected between the sources and the drains of the first and second FETs 4 and 5. Emitters of the first and second PNP transistors 6 and 7 are directly connected to the power supply terminal T with a positive power supply voltage Vcc, and bases of these are connected to the power supply terminal with the power supply voltage Vcc via resistors R8 and R10. Furthermore, collectors of the first and second PNP transistors 6 and 7, drains of the first and second FETs 4 and 5, and both ends of the motor coil 8 are connected to nodes N1 and N2. The diode D2 is connected to the collector of the second PNP transistor 7 (that is, the drain of the first FET 4) and the base side resistor R9 of the first PNP transistor 6, and the diode D3 is connected to the collector of the first PNP transistor 6 (that is, the drain of the second FET 5) and the base side resistor R11 of the second PNP transistor 7, the diodes D4 and D5 are connected between the drains and the sources of the first and second FETs 4 and 5, and the diodes D6 and D7 are connected between the emitters and the collectors of the first and second PNP transistors 6 and 7.

Next, operations of the direct current motor drive circuit of FIG. 1 are described with reference to FIGS. 2(a) to 2(i). FIGS. 2(a) to 2(i) are timing charts showing waveforms at the respective points of the direct current motor dive circuit of FIG. 1, wherein FIG. 2(a) is a timing chart showing a sinusoidal signal a as an output voltage of the hall element 1, FIG. 2(b) is a timing chart showing a rectangular wave signal b (first rectangular wave signal) as an output voltage (voltage at the node P1) of the first comparator 2, FIG. 2(c) is a timing chart showing an output voltage (voltage at the node P2) c (first rectangular wave processed signal) of the first dead time generation circuit, FIG. 2(d) is a timing chart showing an output voltage (voltage at the node P3, equal to the output voltage of the second comparator 3) d of the second dead time generation circuit, FIG. 2(e) is a timing chart showing ON periods e of the first FET 4, FIG. 2(f) is a timing chart showing ON periods f of the second FET 5, FIG. 2(g) is a timing chart showing a waveform of an applied current g of the motor coil 8, FIG. 2(h) is a timing chart showing a waveform of a drain current h of the first FET 4, and FIG. 2(i) is a timing chart showing a waveform of a collector current i of the first PNP transistor 6. The applied current g is shown by defining the direction from the node N2 to the node N1 of the motor coil 8 as positive.

When a brushless direct current motor is driven by the direct current motor drive circuit of FIG. 1, the hall element 1 disposed on a stator generates a sinusoidal signal a shown in FIG. 2(a) between the output terminals 1a and 1b due to a magnetic field change generated by a rotating magnet rotor, and outputs it. The first comparator 2 which has received this sinusoidal signal a by its positive terminal and negative terminal outputs a rectangular wave signal b as a result of comparison (FIG. 2(b)). The second comparator 3 which has received an input of an output voltage of the rectangular signal b from the first comparator 2 outputs a rectangular wave signal d (that is an output voltage of the second dead time generation circuit, also) as a result of inversion of the rectangular wave signal b from the first comparator 2 (FIG. 2(d)). The rectangular signal b is converted into a rectangular wave signal c having gentle rises and steep falls as shown in FIG. 2(c) by the first dead time generation circuit (time constant circuit) that includes the resistor R5, the resistor R6, the capacitor C1, and the diode D1. In addition, a rectangular wave signal d that is at once an output signal of the second comparator 3 and an output signal of the second dead time generation circuit is converted into a signal having gentle rises and steep falls as shown in FIG. 2(d) by the second dead time generation circuit that includes the resistor R7 and the capacitor C2. The first FET 4 that has received an input of the rectangular wave signal c is turned on by delaying by a period Td1 behind the timing T0, and turned off at the timing T1 as shown in FIG. 2(e). On the other hand, the second FET which has received an input of the rectangular wave signal d is turned on by delaying by a period Td2 behind the timing T1 and turned off at the timing T2 as shown in FIG. 2(f). A current flows into the resistors R8 and R9 by the first FET 4 turned on at the timing of (T0+Td1), and the first PNP transistor 6 is turned on by being biased forward. Thereby, the first PNP transistor 6 is turned on at the timing of (T0+Td1), and an applied current g flows from the first PNP transistor 6 to the first FET 4 through the motor coil 8 (FIG. 2(g)). In addition, a current flows into the resistors R10 and R11 by the second FET 5 turned on at the timing of (T1+Td2), and the second PNP transistor 7 is turned on by being biased forward. Thereby, the second PNP transistor 7 is turned on at the timing of (T1+Td2), and an applied current g flows from the second PNP transistor 7 to the second FET 5 through the motor coil 8 (FIG. 2(g)). As shown in FIG. 2(e) and FIG. 2(f), the ON periods e and f of the first and second FETs 4 and 5 do not overlap each other, so that there is no overlapping between the first ON period Ton1 in which the first FET 4 is on and the second ON period in which the second FET 5 is on, and simultaneous energization, that is, a through current is not generated between the first FET 4 and the second PNP transistor 7 or between the second FET 5 and the first PNP transistor 6 in the H-bridge circuit. The drain current h of the first FET 4 when the applied current g flows in the motor coil 8 is shown in FIG. 2(h), and the collector current i of the first PNP transistor 6 is shown in FIG. 2(i). As shown in FIG. 2(i), due to the applied current g of the motor coil 8, a time lag Td3 is generated between turning-on of the first FET 4 and turning-on of the first PNP transistor 6. As shown in FIG. 2(h) and FIG. 2(i), the drain current h of the first FET 4 is a current corresponding to the first ON period Ton1, however, the ON period of the collector current i of the first PNP transistor 6 is lengthened by Td2 due to influence from an induced voltage of the coil. Herein, Td1 and Td2 are approximately 20 microseconds, and Td3 is approximately 1 millisecond.

When the first ON period Ton1 is switched to the second ON period Ton2 or when the second ON period Ton2 is switched to the first ON period Ton1, the applied current in the motor coil 8 suddenly changes, and in the case of a motor coil 8 alone, a spike-shaped high voltage is caused by this sudden change. However, such a spike-shaped high voltage is prevented from being transmitted to the first PNP transistor 6 from the node N1 by the diode D2 and prevented from being transmitted to the second PNP transistor 7 from the node N2 by the diode D3. When the voltage becomes higher at the node N1 than at the node N2 due to the spike-shaped high voltage, a cyclic current flows to the diode D7, an external circuit (for example, a power supply circuit), and the diode D5 in order, and when the voltage becomes higher at the node N2 than at the node N1 due to the spike-shaped high voltage, a cyclic current flows to the diode D6, an external circuit (for example, a power supply circuit), and the diode D4 in order, whereby generation of the spike-shaped high voltage itself is also restrained.

As described above, according to this embodiment, a direct current motor drive circuit is obtained which drives a brushless direct current motor for rotating a magnet rotor by a motor coil 8 that switches polarities (N, S) of a plurality of magnetic poles when the applied current direction is changed, comprising a hall element 1 disposed between predetermined magnetic poles of the motor coil 8, a first comparator 2 that receives an input of a sinusoidal signal outputted from the hall element 1 and outputs a first rectangular wave signal corresponding to the positive voltage of the sinusoidal signal, a second comparator 3 which receives an input of the first rectangular wave signal and outputs a second rectangular wave signal corresponding to the negative voltage of the sinusoidal signal, resistors R5 and R6, a capacitor C1, and a diode D1 of a first dead time circuit which provides the first rectangular wave signal with gentle rises and steep falls and outputs it as a first rectangular wave processed signal, a resistor R7 and a capacitor C2 of a second dead time circuit which provides the second rectangular wave signal with gentle rises and steep falls and outputs it as a second rectangular wave processed signal, and a first FET 4, a second FET 5, a first PNP transistor 6, a second PNP transistor 7, and a motor coil 8 of an H-bridge circuit which receives inputs of the first rectangular wave processed signal and the second rectangular wave processed signal, wherein the H-bridge circuit includes a first series circuit in which the second PNP transistor 7 connected to a positive power supply voltage and the first FET 4 connected to the ground are connected in series via a first node N1, a second series circuit in which the first PNP transistor 6 connected to the positive power supply voltage and the second FET 5 connected to the ground are connected in series via a second node N2, and the motor coil 8 connected to the first node N1 and the second node N2, whereby the first PNP transistor 6 or the second PNP transistor 7 on the high voltage side (positive power supply voltage side) forming the H-bridge circuit is driven by the first FET 4 or the second FET 5 on the ground side, the first comparator 2 or the second comparator 3 as a drive circuit for driving the H-bridge circuit is required to drive only the first FET 4 or the second FET 5, and it is not necessary that the first PNP transistor 6 or the second PNP transistor 7 on the high voltage side (positive power supply side) is driven by an independent separate circuit. Therefore, advantageous effects are obtained in that a drive circuit for a high voltage side switching element required in prior arts can be omitted and the entire circuit can be simplified, and even when the H-bridge circuit is made so as to withstand a higher voltage, the direct current motor drive circuit can be prevented from becoming expensive. In addition, by providing the first and second dead time circuits, simultaneous energization between the first PNP transistor 6 and the second FET 5 or between the second PNP transistor 7 and the first FET 4 can be prevented in the H-bridge circuit.

Figure 6:
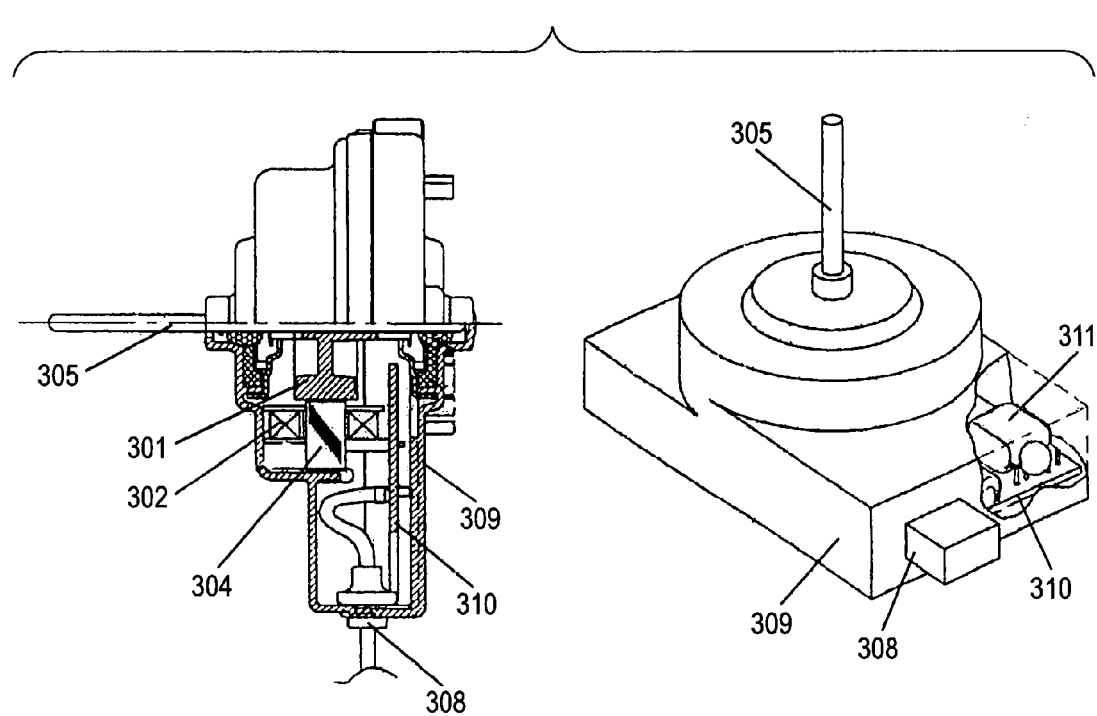
FIG. 6 is a perspective view and a sectional view of a fan motor of the first embodiment of the invention.

Next, a fan motor using this direct current motor drive circuit is described with reference to a perspective view and a sectional view of the fan motor of the first embodiment of the invention of FIG. 6.

The reference numeral 301 denotes a rotor as a rotating part of the fan motor, 304 denotes a stator core forming a stator, 302 denotes a motor coil wound around the stator core 304, and 305 denotes a shaft that rotates integrally with the rotor 301 and is attached with a fan. The reference numeral 310 denotes a printed circuit board on which a stator, an electronic part 311, and a direct current motor drive circuit (not shown), etc., are mounted, 309 denotes a case-shaped outer hull electrical insulator housing the rotor 301, the stator, and the printed circuit board 310, etc., and 308 denotes a power supply connector for supplying electricity to the fan motor.

Description is given above in the case where the parts of the fan motor are housed in the case-shaped outer hull electrical insulator 309, however, these parts may be molded from a mold material such as unsaturated polyester or the like.

Second Embodiment

Figure 4:
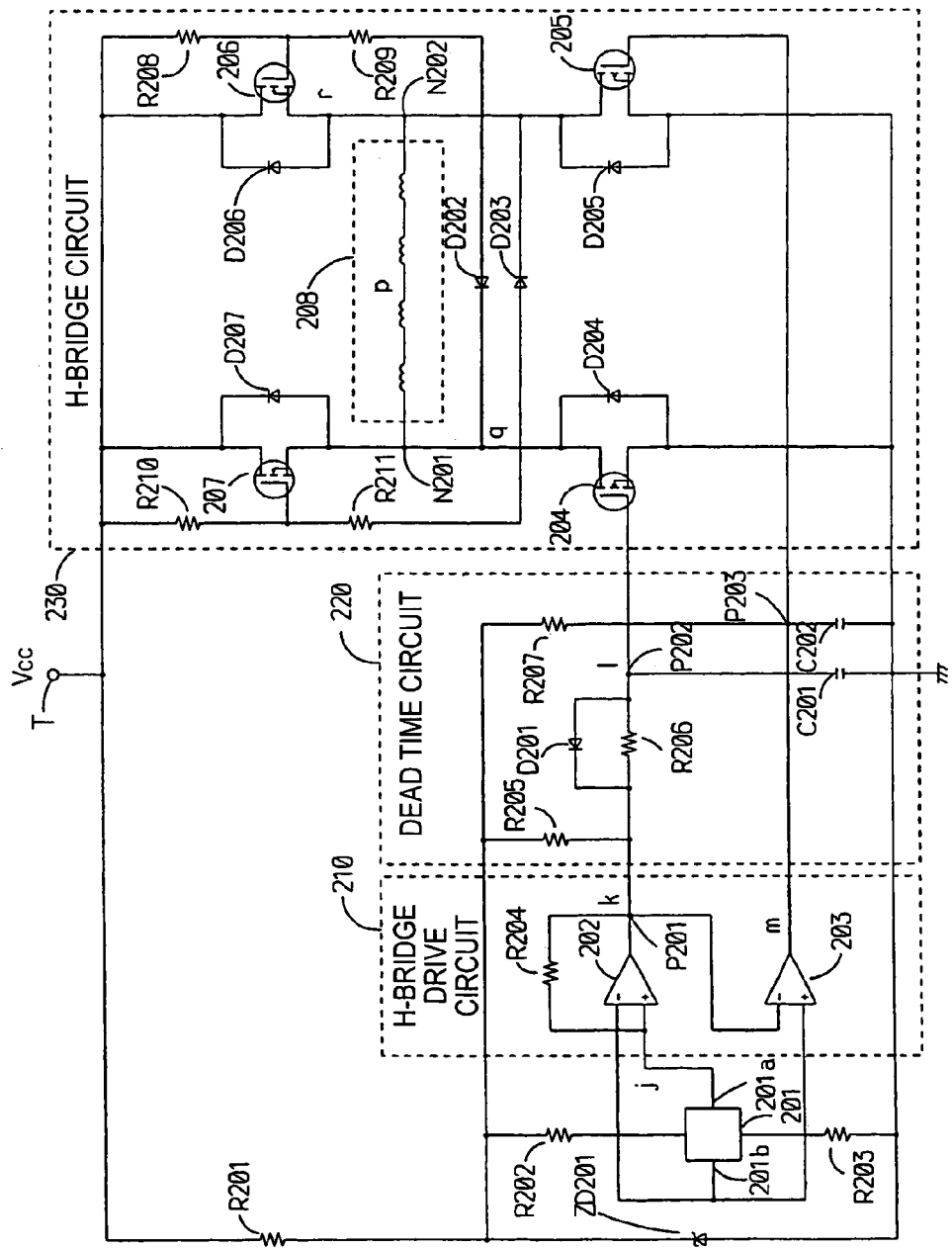
FIG. 4 is a circuit diagram showing a direct current motor drive circuit according to the second embodiment of the invention.

FIG. 4 is a circuit diagram showing a direct current motor drive circuit according to a second embodiment of the invention.

In FIG. 4, a hall element 201 is disposed between magnetic poles formed by a motor coil 208 (described later) as a stator of a direct current motor and detects a rotating position of a magnet rotor as a rotor of the direct current motor, the reference numerals 201a and 201b denote output terminals of the hall element 201, a first comparator 202 receives an input of an output voltage of the hall element 201 and outputs a signal (rectangular wave signal) for switching the energization direction (applied current direction) of the motor coil 208, a second comparator 203 receives an input of an output voltage (rectangular wave signal) of the first comparator 202 and outputs a signal for switching the energization direction of the motor coil 208, first and second FETs 204 and 205 are driven by the first and second comparators 202 and 203, third and fourth P channel FETs 206 and 207 are driven by the first and second FETs 204 and 205, a motor coil 208 switches a plurality of magnetic poles (for example, four poles) N and S when the applied current direction is changed, and a power supply terminal T is supplied with a direct current power of a direct current voltage Vcc (for example, 110V). The reference numerals R201 through R211 denote resistors, ZD201 denotes a zener diode for supplying a rated voltage to the hall element 201 and the first and second comparators 202 and 203, C201 and C202 denote capacitors, D201 through D207 denote diodes, N201 and N202 denote first and second nodes, and P201 through P203 denote third through fifth nodes. The resistor R205 and the resistor R206 (first resistor) and the capacitor C201 form a first dead time generation circuit, and the resistor R207 (second resistor) and the capacitor C202 (second capacitor) form a second dead time generation circuit. A diode D201 is for making falls of the drive voltage (rectangular signal) of the first FET 204 at the node P202 steep, diodes D202 and D203 prevent an induced voltage due to a sudden change in applied current in the motor coil 208, and diodes D204 through D207 extinguish an induced voltage caused by a sudden change in applied current in the motor coil 208 by bypassing and converting it into a cyclic current. The first and second FETs 204 and 205, the third and fourth P channel FETs 206 and 207, and the motor coil 208 form an H-bridge circuit. The gate side resistor R209 of the third P channel FET 206 is a third resistor, and the gate side resistor R211 of the fourth P channel FET 207 is a fourth resistor. In FIG. 4, all circuits except for the motor coil 208 form a direct current motor drive circuit.

Connections and operations of the direct current motor drive circuit thus constructed are described.

First, connections are described. The output terminals 201a and 201b of the hall element 201 are connected to the input side of the first comparator 202, and the output side node P201 (third node) of the first comparator 202 is inputted to a time constant circuit as the first dead time generation circuit, and the output side node P202 (fourth node) of the time constant circuit is connected to the gate of the first FET 204. The output side node P201 (third node) of the first comparator 202 is connected to the input side of the second comparator 203, the output side node P203 (fifth node) of the second comparator 203 is inputted to a time constant circuit as the second dead time generation circuit, and the output side node P203 of the time constant circuit is connected to the gate of the second FET 205. Furthermore, sources of the second FETs 204 and 205 are connected to the ground, drains of the first and second FETs 204 and 205 are connected to drains of the fourth and third P channel FETs 206 and 207, respectively, and the diodes D204 and D205 for bypassing are connected between the sources and the drains of the first and second FETs 204 and 205. Sources of the third and fourth P channel FETs 206 and 207 are directly connected to the power supply terminal T with a positive power supply voltage Vcc and the gate is connected to the power supply terminal T with a positive power supply voltage Vcc via the resistors R208 and R210. Furthermore, drains of the third and fourth P channel FETs 206 and 207, drains of the first and second FETs 204 and 205, and both ends of the motor coil 208 are connected to the nodes N201 and N202. The diode D202 is connected to the drain of the fourth P channel FET 207 (that is, the drain of the first FET 204) and the gate side resistor R209 of the third P channel FET 206, the diode D203 is connected to the drain of the third P channel FET 206 (that is, the drain of the second FET 205), and the gate side resistor R211 of the fourth P channel FET 207, the diodes D204 and D205 are connected between the drains and the sources of the second FETs 204 and 205, and the diodes D206 and D207 are connected between the sources and the drains of the third and fourth P channel FETs 206 and 207.

Figure 5:
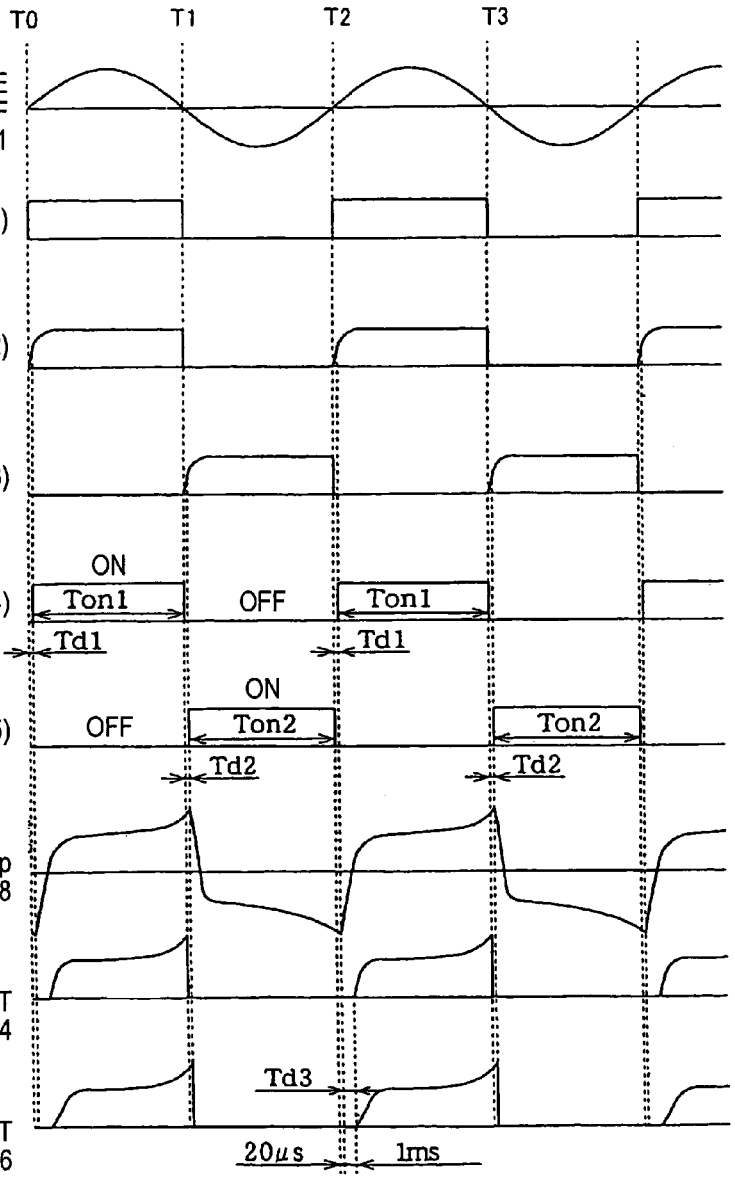
FIG. 5(j) is a timing chart showing a sinusoidal signal j as an output voltage of the hall element.
FIG. 5(k) is a timing chart showing a rectangular wave signal as an output voltage of the first comparator.
FIG. 5(l) is a timing chart showing an output voltage 1 of the first dead time generation circuit.
FIG. 5(m) is a timing chart showing an output voltage m of the second dead time generation circuit.
FIG. 5(n) is a timing chart showing ON periods of the first FET.
FIG. 5(o) is a timing chart showing ON periods o of the second FET.
FIG. 5(p) is a timing chart showing a waveform of an applied current in the motor coil.
FIG. 5(q) is a timing cart showing a waveform of a drain current of the first FET.
FIG. 5(r) is a timing chart showing a waveform of a drain current of the third P channel FET.

Next, operations of the direct current motor drive circuit of FIG. 4 are described with reference to FIGS. 5(j) to 5(r). FIGS. 5(j) to 5(r) are timing charts of wave forms at the respective points of the direct current motor drive circuit of FIG. 4, wherein FIG. 5(j) is a timing chart showing a sinusoidal signal j as an output voltage of the hall element 201, FIG. 5(k) is a timing chart showing a rectangular wave signal k (first rectangular wave signal) as an output voltage (voltage at the node P201) of the first comparator 202, FIG. 5(l) is a timing chart showing an output voltage (voltage at the node P202) l (first rectangular wave processed signal) of the first dead time generation circuit, FIG. 5(m) is a timing chart showing an output voltage (a voltage at the node P203, equal to an output voltage of the second comparator 203) m (that is at once a second rectangular wave signal and a second rectangular wave processed signal) of the second dead time generation circuit, FIG. 5(n) is a timing chart showing ON periods n of the first FET 204, FIG. 5(o) is a timing chart showing ON periods o of the second FET 205, FIG. 5(p) is a timing chart showing a waveform of an applied current p of the motor coil 208, FIG. 5(q) is a timing chart showing a waveform of a drain current q of the first FET 204, and FIG. 5(r) is a timing chart showing a waveform of a drain current r of the third P channel FET 206. The applied current p is shown by defining the direction from the node N202 to N201 of the motor coil 208 as positive.

When the brushless direct current motor is driven by the direct current motor drive circuit of FIG. 4, the hall element 201 disposed on a stator generates a sinusoidal signal j as shown in FIG. 5(j) between the output terminals 201a and 201b due to a magnetic field change generated by a rotating magnet rotor, and outputs the signal. The first comparator 202 which has received an input of this sinusoidal signal j by a positive terminal and a negative terminal outputs a rectangular wave signal k as a result of comparison (FIG. 5(k)). The second comparator 203 that has received an input of the output voltage of the rectangular signal k from the first comparator 202 outputs a rectangular wave signal m (it is an output voltage of the second dead time generation circuit at the same time) as a result of inversion of the rectangular wave signal k from the first comparator 202 (FIG. 5(m)). The rectangular wave signal k is converted into a rectangular wave signal l having gentle rises and steep falls as shown in FIG. 5(l) by the first dead time generation circuit (time constant circuit) including the resistor R205, the resistor R206, the capacitor C201, and the diode D201. The rectangular wave signal m that is at the same time an output signal of the second comparator 203 and an output signal of the second dead time generation circuit is converted into a signal having gentle rises and steep falls as shown in FIG. 5(m) by the second dead time generation circuit including the resistor R207 and the capacitor C202. As shown in FIG. 5(n), the first FET 204 that has received an input of the rectangular wave signal l is turned on by delaying by a period Td1 behind the timing T0, and turned off at the timing of T1. On the other hand, as shown in FIG. 5(o), the second FET 205 that has received an input of the rectangular wave signal m is turned on by delaying by a period Td2 behind the timing T1, and turned off at the timing of T2. A current is made to flow in the resistors R208 and R209 by the first FET 204 that has been turned on at the timing of (T0+Td1), and the third P channel FET 206 is turned on by being biased forward. Thereby, the third P channel FET 206 is turned on at the timing of (T0+Td1), and an applied current p reaching the first FET 204 from the third P channel FET 206 via the motor coil 208 flows (FIG. 5(p)). A current is made to flow in the resistors R210 and R211 by the second FET 205 turned on at the timing of (T1+Td2), and the fourth P channel FET 207 is turned on by being biased forward. Thereby, the fourth P channel FET 207 is turned on at the timing of (T1+Td2), and an applied current p reaching the second FET 205 from the fourth P channel FET 207 via the motor coil 208 flows (FIG. 5(p)). As shown in FIG. 5(n) and FIG. 5(o), since the ON periods n and o of the second FETs 204 and 205 do not overlap each other, there is no overlapping between the first ON period Ton1 in which the first FET 204 is on and the second ON period Ton2 in which the second FET 205 is on, and simultaneous energization, that is, a through current is not generated between the first FET 204 and the fourth P channel FET 207 or between the second FET 205 and the third P channel FET 206 in the H-bridge circuit. The drain current q of the first FET 204 when the applied current P flows in the motor coil 208 is shown in FIG. 5(q), and the drain current r of the third P channel FET 206 in this case is shown in FIG. 5(r). As shown in FIG. 5(r), due to the applied current p of the motor coil 208, a time lag Td3 occurs between turning-on of the first FET 204 and turning-on of the third P channel FET 206. As shown in FIG.

5(q) and FIG. 5(r), the drain current q of the first FET 204 is a current corresponding to the first ON period Ton1, however, the ON period of the drain current r of the third P channel FET 206 is lengthened by Td2 due to influence from an induced voltage of the coil. Herein, Td1 and Td2 are approximately 20 microseconds, and Td3 is approximately 1 millisecond.

When the first ON period Ton1 is switched to the second ON period Ton2 or when the second ON period Ton2 is switched to the first ON period Ton1, the applied current suddenly changes in the motor coil 208, and in the case of the motor coil 208 alone, a spike-shaped high voltage is caused by this sudden change. However, this spike-shaped high voltage is prevented from being transmitted to the third P channel FET 206 from the node N201 by the diode D202, and prevented from being transmitted to the fourth P channel FET 207 from the node N202 by the diode D203. When the voltage becomes higher at the node N201 than at the node N202 due to the spike-shaped high voltage, a cyclic current flows to the diode D207, an external circuit (for example, a power supply circuit), and the diode D205 in order, and when the voltage becomes higher at the node N202 than at the node N201 due to the spike-shaped high voltage, a cyclic current flows to the diode D206, an external circuit (for example, a power supply circuit), and the diode D204 in order, and generation of the spike-shaped high voltage itself is also restrained.

As described above, according to this embodiment, a direct current motor drive circuit which drives a brushless direct current motor for rotating a magnet rotor by a motor coil 208 that switches polarities (N and S) of a plurality of magnetic poles when the direction of the applied current is changed, comprises a hall element 201 disposed between predetermined magnetic poles of the motor coil 208, a first comparator 202 that receives an input of a sinusoidal signal outputted from the hall element 201 and outputs a first rectangular wave signal corresponding to the positive voltage of the sinusoidal signal, a second comparator 203 that receives an input of the first rectangular wave signal and outputs a second rectangular wave signal corresponding to the negative voltage of the sinusoidal signal, resistors R205 and R206, a capacitor C201, and a diode D201 of a first dead time circuit that provides the first rectangular wave signal with gentle rises and steep falls and outputs it as a first rectangular wave processed signal, a resistor R207 and a capacitor C202 of a second dead time circuit that provides the second rectangular wave signal with gentle rises and steep falls and outputs it as a second rectangular wave processed signal, and first through fourth FETs 204 through 207 and a motor coil 208 of an H-bridge circuit that receives inputs of the first rectangular wave processed signal and the second rectangular wave processed signal, wherein the H-bridge circuit includes a first series circuit in which a fourth P channel FET 207 connected to a positive power supply voltage and a first FET 204 connected to the ground are connected in series via a first node N201, a second series circuit in which a third P channel FET 206 connected to the positive power supply voltage and a second FET 205 connected to the ground are connected in series via a second node N202, and the motor coil 208 connected to the first node N201 and the second node N202, whereby the third P channel FET 206 or the fourth P channel FET 207 on the high voltage side (positive power supply voltage side) forming the H-bridge circuit is driven by the first FET 204 or the second FET 205 on the ground side, the first comparator 202 or the second comparator 203 as a drive circuit for driving the H-bridge circuit is required to drive only the first FET 204 or the second FET 205, and it is not necessary that the third P channel FET 206 or the fourth P channel FET 207 on the high voltage side (positive power supply voltage side) is driven by an independent separate circuit, and therefore, advantageous effects are obtained in that the entire circuit can be simplified by omitting a drive circuit for a conventionally required high voltage side switching element, and even when the H-bridge circuit is made so as to withstand a higher voltage, the direct current drive circuit can be prevented from becoming expensive. In addition, by providing the first and second dead time circuits, simultaneous energization between the third P channel FET 206 and the second FET 205 or between the fourth P channel FET 207 and the first FET 204 can be prevented in the H-bridge circuit.

The present invention relates to a direct current motor drive circuit which drives a brushless direct current motor for rotating a magnet rotor by a motor coil that switches a plurality (for example, four) of magnetic poles N and S when the direction of an applied current is changed, wherein even when the H-bridge circuit is made so as to withstand a higher voltage, the direct current motor drive circuit can be simplified and prevented from becoming expensive.

What is claimed is:

1. A direct current motor drive circuit for driving a brushless direct current motor, comprising
    a hall element disposed between predetermined magnetic poles of a coil of the brushless direct current motor;
    an H-bridge drive circuit including a first comparator which receives an input of a sinusoidal signal outputted from the hall element and outputs a first rectangular wave signal corresponding to the positive voltage of the sinusoidal signal and a second comparator which receives an input of the first rectangular wave signal and outputs a second rectangular wave signal corresponding to the negative voltage of the sinusoidal signal;
    a dead time circuit which carries out rectangular wave signal processing for turning the first rectangular signal and the second rectangular signal on at timings in which their ON voltage periods are different; and
    an H-bridge circuit which receives inputs of the first rectangular wave signal and the second rectangular wave signal subjected to signal processing in the dead time circuit,
    wherein the H-bridge circuit includes
        a first series circuit in which a second switching element connected to a positive power supply voltage and a first field effect transistor (referred to as FET) connected to the ground are connected in series via a first node,
        a second series circuit in which a first switching element connected to the positive power supply voltage and a second FET connected to the ground are connected in series via a second node, and
        a coil of the direct current motor connected to the first node and the second node.

2. The direct current motor drive circuit according to claim 1, wherein the first switching element and the second switching element consist of P channel transistors (referred to as PNP transistors), respectively.

3. The direct current motor drive circuit according to claim 1, wherein the first switching element and the second switching element consist of P channel FETs, respectively.

4. The direct current motor drive circuit according to claim 1, wherein the dead time circuit carries out rectangular wave signal processing for alternately turning the first rectangular wave signal and the second rectangular wave signal on at timings so that the ON voltage periods thereof do not overlap each other.

5. A fan motor having a direct current motor drive circuit which drives a brushless direct current motor, comprising:
   a hall element that is disposed between predetermined magnetic poles of a coil of the brushless direct current motor;
   an H-bridge drive circuit including a first comparator that receives an input of a sinusoidal signal outputted from the hall element and outputs a first rectangular signal corresponding to the positive voltage of the sinusoidal signal, and a second comparator that receives an input of the first rectangular wave signal and outputs a second rectangular wave signal corresponding to the negative voltage of the sinusoidal signal;
   a dead time circuit which carries out rectangular wave signal processing for turning the first rectangular wave signal and the second rectangular wave signal on at timings wherein ON voltage periods thereof are different from each other; and
   an H-bridge circuit that receives inputs of the first rectangular wave signal and the second rectangular wave signal subjected to signal processing in the dead time circuit,
   wherein the H-bridge circuit includes
      a first series circuit in which a second switching element connected to a positive power supply voltage and a first field effect transistor (referred to as FET) connected to the ground are connected in series via a first node,
      a second series circuit in which a first switching element connected to the positive power supply voltage and a second FET connected to the ground are connected in series via a second node, and
      a coil of the direct current motor connected to the first node and the second node.

6. A fan motor according to claim 5, wherein the dead time circuit carries out rectangular wave signal processing for alternately turning the first rectangular wave signal and the second rectangular wave signal on at timings so that the ON voltage periods thereof do not overlap each other.

7. A direct current motor drive circuit which drives a brushless direct current motor for rotating a magnet rotor that switches polarities of a plurality of magnetic poles when the direction of an applied current is changed, comprising:
   a hall element disposed between predetermined magnetic poles of the motor coil;
   a first comparator which receives an input of a sinusoidal signal outputted from the hall element and outputs a first rectangular wave signal corresponding to the positive voltage of the sinusoidal signal;
   a second comparator which receives an input of the first rectangular wave signal and outputs a second rectangular wave signal corresponding to the negative voltage of the sinusoidal signal;
   a first dead time circuit which provides the first rectangular wave signal with gentle rises and steep falls and outputs it as a first rectangular wave processed signal;
   a second dead time circuit which provides the second rectangular wave signal with gentle rises and steep falls and outputs it as a second rectangular wave processed signal; and
   an H-bridge circuit which receives inputs of the first rectangular wave processed signal and the second rectangular wave processed signal,
   wherein the H-bridge circuit includes
      a first series circuit in which a second switching element connected to a positive power supply voltage and a first FET connected to the ground are connected in series via a first node,
      a second series circuit in which a first switching element connected to the positive power supply voltage and a second FET connected to the ground are connected in series via a second node, and
      the motor coil connected to the first node and the second node.

8. The direct current motor drive circuit according to claim 7, wherein the first switching element and the second switching element are a first PNP transistor and a second PNP transistor, respectively, emitters of the first PNP transistor and the second PNP transistor are connected to the positive power supply voltage, and collectors of the first PNP transistor and the second PNP transistor are connected to drains of the second FET and the first FET, respectively, bases of the first PNP transistor and the second PNP transistor are connected to drains of the first FET and the second FET via a third resistor and a fourth resistor, respectively, the first rectangular wave processed signal and the second rectangular wave processed signal are inputted to gates of the first FET and the second FET, and sources of the first FET and the second FET are connected to the ground.

9. The direct current motor drive circuit according to claim 7, wherein the first switching element and the second switching element are a first P channel FET and a second P channel FET, respectively, sources of the first P channel FET and the second P channel FET are connected to the positive power supply voltage, drains of the first P channel FET and the second P channel FET are connected to drains of the second FET and the first FET, respectively, gates of the first P channel FET and the second P channel FET are connected to drains of the first FET and the second FET via a third resistor and a fourth resistor, respectively, the first rectangular wave processed signal and the second rectangular wave processed signal are inputted to gates of the first FET and the second FET, and sources of the first FET and the second FET are connected to the ground.

10. The direct current motor drive circuit according to claim 7, wherein the first dead time circuit includes a first resistor connected to a third node as an output point of the first comparator and the first capacitor connected in series to the first resistor via a fourth node, the fourth node is connected to the gate of the first FET, the second dead time includes a second resistor connected to a high voltage side of a fifth node as an output point of the second comparator and a second capacitor connected in series to the second resistor via the fifth node, and the fifth node is connected to the gate of the second FET.

11. The direct current motor drive circuit according to claim 8, wherein the first dead time circuit includes a first resistor connected to a third node as an output point of the first comparator and a first capacitor connected in series to the first resistor via a fourth node, the fourth node is connected to the gate of the first FET, and the second dead time circuit includes a second resistor connected to a high voltage side of a fifth node as an output point of the second comparator and a second capacitor connected in series to the second resistor via a fifth node, and the fifth node is connected to the gate of the second FET.

* * * * *